(12) United States Patent
Zhou

(10) Patent No.: US 11,757,405 B2
(45) Date of Patent: Sep. 12, 2023

(54) OSCILLATOR CIRCUIT

(71) Applicant: Huawei Technologies Co., Ltd., Shenzhen (CN)

(72) Inventor: Yunfang Zhou, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/733,158

(22) Filed: Apr. 29, 2022

(65) Prior Publication Data

US 2022/0263463 A1 Aug. 18, 2022

Related U.S. Application Data

(63) Continuation of application No. PCT/CN2019/114883, filed on Oct. 31, 2019.

(51) Int. Cl.
*H03B 5/08* (2006.01)
*H03B 5/32* (2006.01)

(52) U.S. Cl.
CPC ............ *H03B 5/08* (2013.01); *H03B 5/323* (2013.01); *H03B 2201/02* (2013.01)

(58) Field of Classification Search
CPC ....................................................... H03B 5/08
USPC ..................................................... 331/117 R
See application file for complete search history.

(56) References Cited

U.S. PATENT DOCUMENTS

| | | | |
|---|---|---|---|
| 6,121,850 A | 9/2000 | Ghoshal | |
| 9,071,193 B1* | 6/2015 | Caviglia | ............... H03B 5/1212 |
| 10,447,204 B2 | 10/2019 | Moslehi Bajestan et al. | |
| 2007/0103248 A1 | 5/2007 | Nakamura et al. | |
| 2008/0278250 A1* | 11/2008 | Hung | ................... H03B 5/1215 |
| | | | 455/552.1 |
| 2011/0057732 A1 | 3/2011 | Taylor et al. | |
| 2014/0070897 A1 | 3/2014 | Brekelmans et al. | |
| 2017/0085221 A1 | 3/2017 | Ryu et al. | |
| 2017/0111009 A1* | 4/2017 | Chiu | ..................... H03B 5/1212 |
| 2017/0179881 A1* | 6/2017 | Caffee | ...................... H03B 5/08 |
| 2019/0103834 A1* | 4/2019 | Gu | ........................ H03B 5/1265 |

FOREIGN PATENT DOCUMENTS

| | | |
|---|---|---|
| CN | 1964183 A | 5/2007 |
| CN | 103297000 A | 9/2013 |
| CN | 107615647 A | 1/2018 |
| EP | 2961062 A2 | 12/2015 |

* cited by examiner

*Primary Examiner* — Joseph Chang
(74) *Attorney, Agent, or Firm* — Conley Rose, P.C.

(57) ABSTRACT

An oscillator circuit includes an amplifier including a first transconductance amplifier and a second transconductance amplifier; and a resonator including a capacitor element and an inductor element. The capacitor element includes a first capacitor and a second capacitor, the inductor element includes a tapped inductor, the tapped inductor includes a first segment of inductor and a second segment of inductor, and the first segment of inductor and the second segment of inductor are coupled using the first capacitor. The first segment of inductor includes a first terminal and a second terminal coupled to an input terminal and an output terminal of the first transconductance amplifier respectively. The second segment of inductor includes a third terminal and a fourth terminal coupled to an input terminal and an output terminal of the second transconductance amplifier, respectively.

20 Claims, 10 Drawing Sheets

OSCILLATOR CIRCUIT

CROSS-REFERENCE TO RELATED APPLICATIONS

This is a continuation of International Patent Application No. PCT/CN2019/114883 filed on Oct. 31, 2019, which is hereby incorporated by reference in its entirety.

TECHNICAL FIELD

This disclosure relates to the field of electronic technologies, and in particular, to an oscillator circuit.

BACKGROUND

With the development of wireless communication systems such as cellular networks, wireless local area networks (WLANs), satellite networks, Global Positioning System (GPS), and the like, demands for smaller size, lower cost, and higher frequency products have continuously increased. In this regard, voltage-controlled oscillators (VCO) play a critical role in communication systems, providing periodic signals required for timing in digital circuits and frequency translation in radio frequency (RF) circuits. A VCO may be embodied as a stand-alone module separate from other circuits or integrated into an application-specific integrated circuit (ASIC) for use in devices. The devices are, for example, but not limited to, mobile phones, base stations, and virtually all communication devices. As RF frequencies increase and supply voltages decrease, it has become increasingly difficult to design VCOs that meet system noise and power requirements and meet the demands for smaller size, lower cost, and higher frequency products.

Noise performance of an LC resonant VCO is directly related to signal power of the inductor-capacitor (LC) resonant VCO, and the signal power is proportional to the energy stored in a resonant LC energy storage circuit. In conventional VCO designs, the energy stored in the LC circuit is proportional to a size of an inductor and a square of a supply voltage of an amplifier in the VCO. The supply voltage of the amplifier also needs to decrease as a geometric shape of a semiconductor device shrinks. To compensate for the decrease in voltage, the inductor used in the LC energy storage circuit also needs to decrease in size, to remain noise performance of the VCO unchanged. Increases in required frequency also require decreases in the size of the inductor. However, the decreases in the size of the inductor presents a challenge, because a smaller size of the inductor indicates a lower quality factor (Q) of the inductor, further increasing thermal noise of the VCO.

SUMMARY

This disclosure provides an oscillator circuit, to improve performance of an oscillator. To achieve the foregoing objective, the following technical solutions are used in this disclosure.

According to a first aspect, an oscillator circuit is provided. The oscillator circuit includes an amplifier, including a first transconductance amplifier and a second transconductance amplifier, and a resonator, including a capacitor element and an inductor element. The capacitor element includes a first capacitor and a second capacitor, the inductor element includes a tapped inductor, the tapped inductor includes a first segment of inductor and a second segment of inductor, and the first segment of inductor and the second segment of inductor are coupled by using the first capacitor. The first segment of inductor includes a first terminal and a second terminal. The second segment of inductor includes a third terminal and a fourth terminal. The first terminal and the second terminal are respectively coupled to an input terminal and an output terminal of the first transconductance amplifier. The third terminal and the fourth terminal are respectively coupled to an input terminal and an output terminal of the second transconductance amplifier. The first terminal and the fourth terminal are coupled by using the second capacitor. In the foregoing technical solution, the first transconductance amplifier and the first segment of inductor may be used as one single-end three-point oscillator, and the second transconductance amplifier and the second segment of inductor may be used as another single-end three-point oscillator. The two single-end three-point oscillators are coupled together by using the first capacitor and the second capacitor, so that phase noise of the oscillator circuit can be reduced. This improves performance of the oscillator circuit.

In a possible implementation of the first aspect, the tapped inductor includes a plurality of conductive segments, and the plurality of conductive segments constitute an 8-shaped physical loop through layer-hopping crossing. In the foregoing possible implementation, the tapped inductor includes two half loops with opposite magnetic field directions. When two magnetic fields with opposite directions are interfered with by each other, generated induced currents are offset, and therefore the tapped inductor has quite good anti-interference performance.

In a possible implementation of the first aspect, the plurality of conductive segments is separately cabled at a topmost metal layer and a second topmost metal layer or a topmost metal layer and a redistribution layer. Optionally, during cabling, the plurality of conductive segments included in the 8-shape physical loop include a non-crossing part and two cross parts, the non-crossing part and one of the two cross parts may be cabled at the topmost metal layer, and the other cross part may be cabled at the second topmost metal layer or the redistribution layer. In the foregoing possible implementation, interference caused by another element to the tapped inductor in the oscillator circuit can be reduced.

In a possible implementation of the first aspect, the first terminal and the fourth terminal are two output terminals of the tapped inductor, and the second terminal and the third terminal are two tap terminals of the tapped inductor. In the foregoing possible implementation, positions of the second terminal and the third terminal may be changed to adjust power consumption, output amplitude, and phase noise of the oscillator circuit, so that performance of the oscillator circuit is improved.

In a possible implementation of the first aspect, two tap segments corresponding to the second terminal and the third terminal are cabled in the middle of the tapped inductor. When the physical loop is cabled at the topmost metal layer and the second topmost metal layer, a part in the two tap segments that does not overlap the physical loop may be cabled at the topmost metal layer, and a part in the two tap segments that overlaps the physical loop may be cabled at a next metal layer of the second topmost metal layer. When the physical loop is cabled at the topmost metal layer and the redistribution layer, a part in the two tap segments that does not overlap the physical loop may be cabled at the topmost metal layer, and a part in the two tap segments that overlaps the physical loop may be cabled at the second topmost metal layer. In the foregoing possible implementation, the two tap segments are cabled in the middle of the tapped inductor, so that induced currents of two symmetrical halves of the tapped inductor can be offset. This improves performance of the oscillator circuit.

In a possible implementation of the first aspect, an input voltage of the amplifier exceeds a supply voltage of the amplifier. In the foregoing possible implementation, when the input voltage exceeds the supply voltage, a gain of the oscillator circuit can be increased, and a power requirement on the oscillator circuit can be reduced.

In a possible implementation of the first aspect, the first transconductance amplifier and the second transconductance amplifier each include an N-type metal-oxide-semiconductor (NMOS) transistor and a P-type metal-oxide-semiconductor (PMOS) transistor. A source of the NMOS transistor is coupled to a positive supply rail, gates of the NMOS transistor and the PMOS transistor are coupled as an input terminal, drains of the NMOS transistor and the PMOS transistor are coupled as an output terminal, and a source of the PMOS transistor is coupled to a ground terminal. In the foregoing possible implementation, the first transconductance amplifier and the second transconductance amplifier form a negative resistance by using cross-coupled positive feedback, so that loss of a tank formed by the resonator can be offset. This improves performance of the oscillator circuit. In addition, input impedance and output impedance of the first transconductance amplifier and the second transconductance amplifier are different. By adjusting a ratio of the input impedance to the output impedance, the oscillator circuit can work in a linear region, so that the oscillator circuit has lower phase noise.

According to a second aspect, a non-transitory computer-readable medium used together with a computer is provided. The computer has software for creating an integrated circuit, the computer-readable medium stores one or more computer-readable data structures, the one or more computer-readable data structures have photomask data for producing an oscillator circuit, and the oscillator circuit includes an amplifier, including a first transconductance amplifier and a second transconductance amplifier, and a resonator, including a capacitor element and an inductor element. The capacitor element includes a first capacitor and a second capacitor, the inductor element includes a tapped inductor, the tapped inductor includes a first segment of inductor and a second segment of inductor, and the first segment of inductor and the second segment of inductor are coupled by using the first capacitor. The first segment of inductor includes a first terminal and a second terminal. The second segment of inductor includes a third terminal and a fourth terminal. The first terminal and the second terminal are respectively coupled to an input terminal and an output terminal of the first transconductance amplifier. The third terminal and the fourth terminal are respectively coupled to an input terminal and an output terminal of the second transconductance amplifier. The first terminal and the fourth terminal are coupled by using the second capacitor.

In a possible implementation of the second aspect, the tapped inductor includes a plurality of conductive segments, and the plurality of conductive segments constitute an 8-shaped physical loop through layer-hopping crossing.

In a possible implementation of the second aspect, the plurality of conductive segments is separately cabled at a topmost metal layer and a second topmost metal layer or a topmost metal layer and a redistribution layer.

In a possible implementation of the second aspect, the first terminal and the fourth terminal are two output terminals of the tapped inductor, and the second terminal and the third terminal are two tap terminals of the tapped inductor.

In a possible implementation of the second aspect, two tap segments corresponding to the second terminal and the third terminal are cabled in the middle of the tapped inductor.

In a possible implementation of the second aspect, an input voltage of the amplifier exceeds a supply voltage of the amplifier.

In a possible implementation of the second aspect, the first transconductance amplifier and the second transconductance amplifier each include an NMOS transistor and a PMOS transistor. A source of the NMOS transistor is coupled to a positive supply rail, gates of the NMOS transistor and the PMOS transistor are coupled as an input terminal, drains of the NMOS transistor and the PMOS transistor are coupled as an output terminal, and a source of the PMOS transistor is coupled to a ground terminal.

It may be understood that any provided non-transitory computer-readable medium used together with the computer includes the oscillator circuit provided above. Therefore, for beneficial effects that can be achieved by the non-transitory computer-readable medium, refer to beneficial effects in the oscillator circuit provided above, and details are not described herein again.

DESCRIPTION OF EMBODIMENTS

The making and using of embodiments are discussed in detail below. However, it should be understood that many concepts provided in this disclosure may be implemented in a plurality of specific environments. Specific embodiments discussed herein are merely illustrative of specific ways to make and use the teachings and technology herein, and do not limit the scope of this disclosure.

Unless defined otherwise, all technical and scientific terms used herein have the same meaning as commonly understood by a person of ordinary skill in the art to which this disclosure belongs.

Circuits or other components may be described as or referred to as being "configured" to perform one or more tasks. In this case, "configured" is used to imply a structure by indicating that the circuit/component includes a structure (for example, a circuit system) performing one or more tasks during an operation. Therefore, the circuit/component may be said to be configured to perform the task even when the specified circuit/component is not currently operational (for example, is not on). The circuit/component used together with "configured" includes hardware such as a circuit for performing an operation. The statement that the circuit/component is "configured" to perform one or more tasks clearly indicates that 35U.S.C. 112(f) is not invoked.

In this specification, reference to "an embodiment", "embodiments", "a specific embodiment", or "a particular embodiment" indicates that a particular characteristic, structure, or feature described with reference to a particular embodiment is included in at least one embodiment but is not necessarily included in all particular embodiments. Therefore, in different locations of this specification, the phrases "in a particular embodiment", "in an embodiment" and "in a specific embodiment" do not necessarily refer to a same embodiment. Furthermore, the particular features, structures, or characteristics of any specific embodiment may be combined in any suitable manner with one or more other particular embodiments. It should be understood that other variations and modifications of the particular embodiments described and illustrated herein are possible in light of the teachings herein and are construed as a part of the scope of this disclosure.

Figure 1:
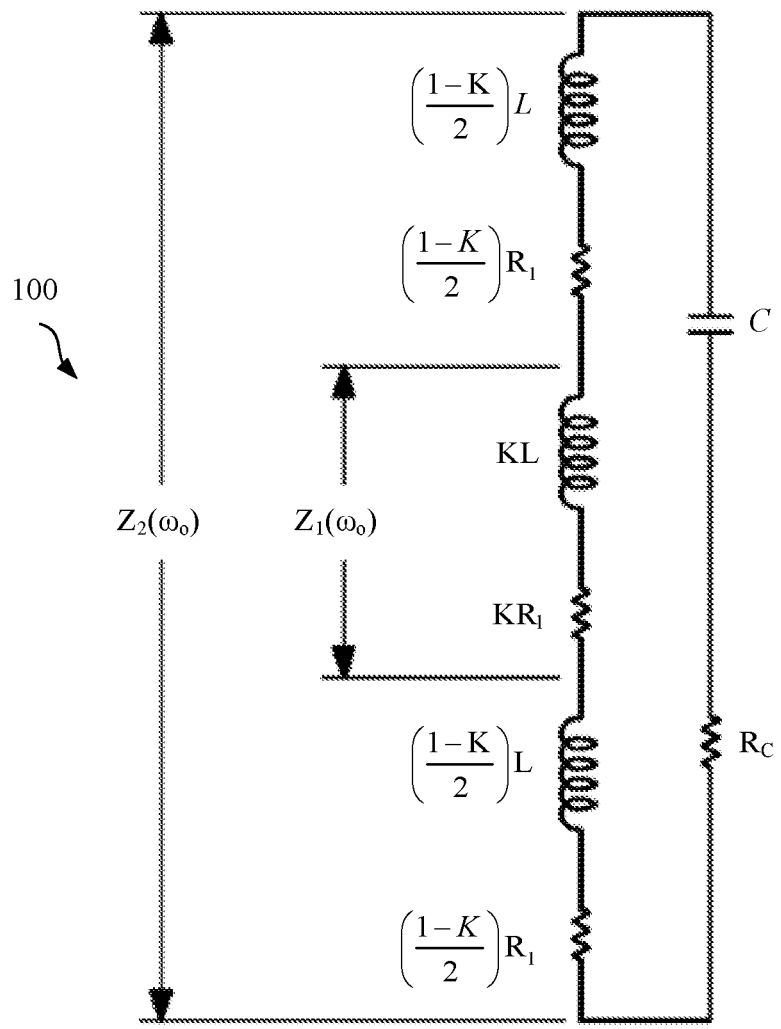
FIG. 1 is a schematic diagram of a differential LC energy storage circuit according to an embodiment of this disclosure.

FIG. 1 is a schematic diagram of an LC energy storage circuit 100 including parasitic resistors $R_c$ and $R_1$. The LC energy storage circuit 100 is used in a differential VCO. The LC energy storage circuit 100 may also be referred to as an LC resonance circuit, an LC resonator, a resonator, or the like. A VCO amplifier provides a current to input impedance of the LC energy storage circuit 100, and a voltage that is generated by the LC energy storage circuit 100 and that passes through the LC circuit is equal to a voltage of an input terminal of the amplifier. In a conventional single inductor VCO (for example, pierce configuration), driving impedance of the amplifier is $Z_2(\omega_o)$, and the voltage of the input terminal of the amplifier represents a voltage passing through $Z_2(\omega_o)$.

In this disclosure, a single inductor is tapped (for example, divided into at least two parts) based on a coefficient K. The amplifier drives an inductor tap defined by impedance $Z_1(\omega_o)$, and the voltage of the input terminal of the amplifier comes from a signal of an inductor tap defined by the impedance $Z_2(\omega_o)$. Theoretically, inductor segments KL and (1−K)/2×L may be construed as separate inductors for small inductance and very high frequencies. However, separate inductors are impractical due to physical size requirements and mutual coupling.

Because the input terminal and an output terminal of the amplifier are located at different points (namely, $Z_2$ and $Z_1$) of the LC energy storage circuit 100, an input voltage of the amplifier in the VCO may be far greater than an output voltage that is of the amplifier and that is determined through measurement by a voltage divider of the tapped inductor. There are many advantages to this arrangement.

Hot carrier injection (HCI) voltage limitations of the amplifier are constrained to the output terminal. This allows an input signal to exceed supply voltage restrictions of the amplifier. Because the input voltage represents energy stored in the LC energy storage circuit 100, in a case of same total inductance, the VCO has lower noise than a VCO with a conventional resonator, because a voltage of the LC energy storage circuit 100 is higher. In addition, the inductor can meet a noise requirement without decreasing in size, so that Q of the inductor is high when the inductor is integrated into an integrated circuit (for example, is used as a part of an ASIC).

Since a voltage input to the amplifier exceeds power supply rails, a gain of the amplifier is higher than given power consumption. An output current of the amplifier is a product of the input voltage passing through $Z_2$ and transconductance $g_m$ of the amplifier. Since the input voltage is increased, the amplifier has more gains for a same current. This reduces a power requirement for the system.

It may be learned from FIG. 1 and the following formulas (1) to (5) that the impedance $Z_1(\omega_o)$ is a factor $K^2$ lower than the impedance $Z_2(\omega_o)$ in the LC energy storage circuit 100. Linearity of the amplifier under large signal conditions depends on linearity at the output terminal rather than the input terminal of the amplifier. Low impedance of an output terminal of the VCO reduces nonlinear mixing of flicker noise and a VCO frequency, so that sideband noise spectrum utilization near the output terminal is improved. A person skilled in the art should appreciate that flicker noise of a baseband frequency is electronic noise that has a density spectrum of 1/ω and that is mixed by a nonlinear element. The flicker noise generates $1/\omega^3$ part of single-sideband phase noise of the VCO.

a resonance value $$\omega_o^2 = \frac{1}{LC}, \text{ and } \omega_o L = X_o \qquad (1)$$

$$\text{Re}\{Z_1(\omega_o)\} = \frac{KR_l[(1-K)R_l + R_c]}{R_l + R_c} + \frac{(K\omega_o L)^2}{R_l + R_c} \qquad (2)$$

$$\text{Re}\{Z_1(\omega_o)\} \approx K^2 \left[\frac{X_0^2}{R_l + R_c}\right] \qquad (3)$$

$$\text{Re}\{Z_2(\omega_o)\} = \frac{R_l R_c}{R_l + R_c} + \frac{(\omega_o L)^2}{R_l + R_c} \qquad (4)$$

$$\text{Re}\{Z_2(\omega_o)\} \approx \left[\frac{X_0^2}{R_l + R_c}\right] \qquad (5)$$

$\omega_o$ is an oscillation frequency (radians/second).
L is an inductance.
C is a capacitance.
$R_1$ is a parasitic resistance of an inductor.
$R_c$ is a parasitic resistance of a capacitor.
K is a constant related to $Z_1$ and $Z_2$.
$X_o$ is a reactance of the inductor L at the resonance frequency of $\omega_o$.

Figure 2:
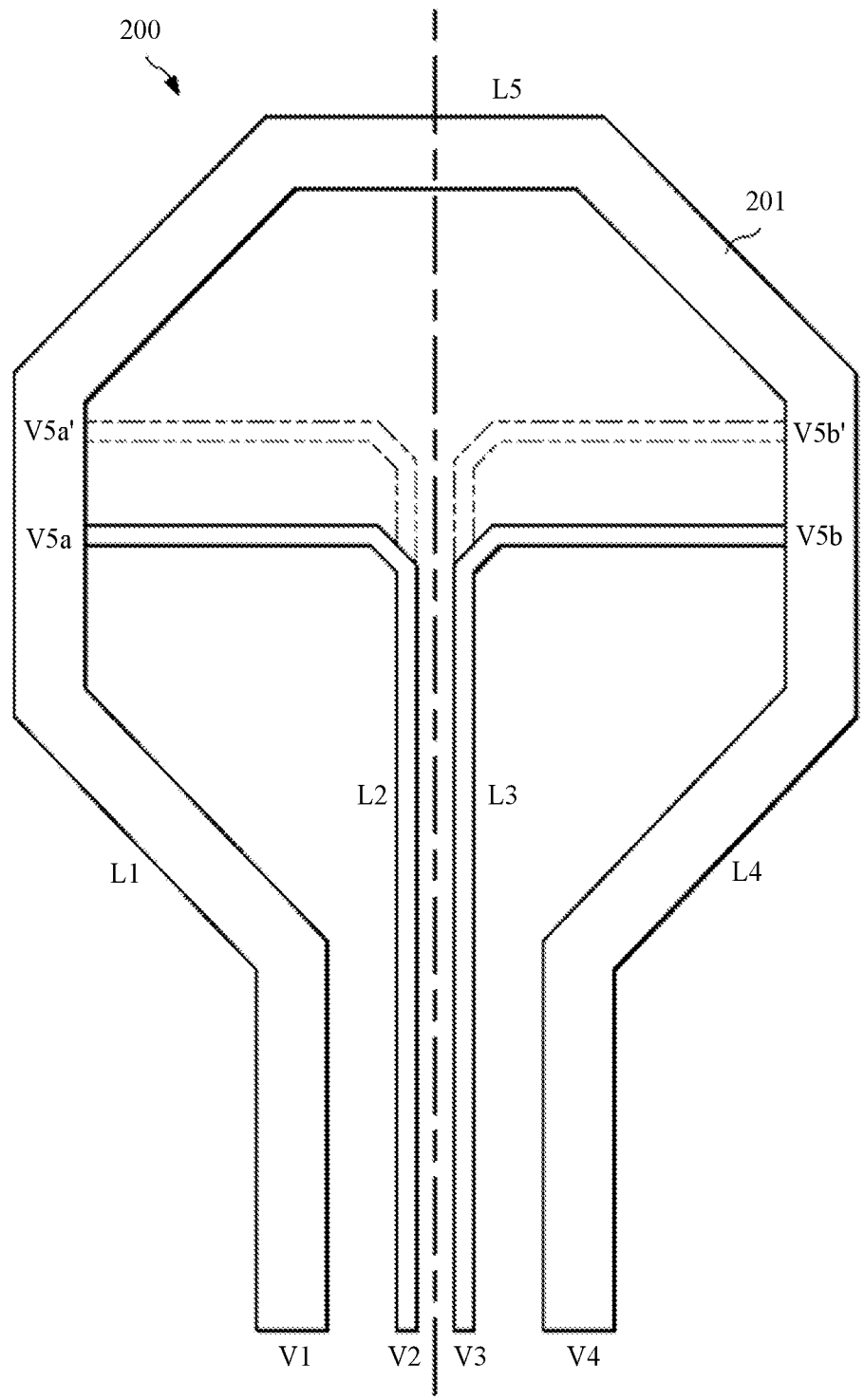
FIG. 2 shows an example layout of a first differential tapped inductor according to an embodiment of this disclosure.
Figure 3:
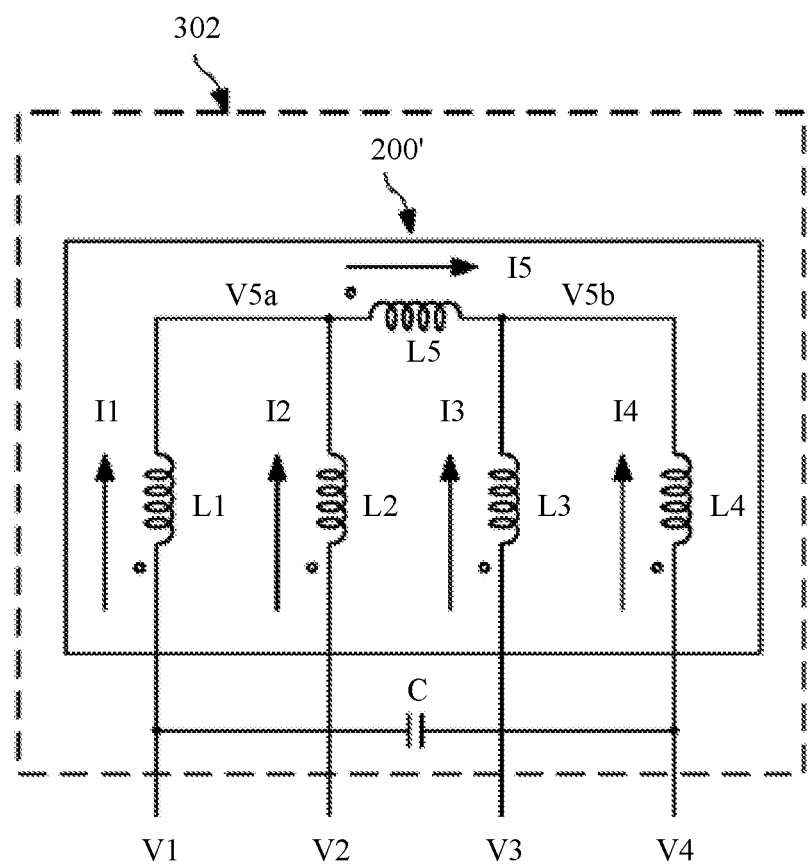
FIG. 3 shows a first differential tapped LC energy storage circuit according to an embodiment of this disclosure.

FIG. 2 shows an example layout of a differential tapped inductor 200 used in an LC energy storage circuit (for example, the LC energy storage circuit shown in FIG. 1) according to a principle of this disclosure and integrated into an integrated circuit. FIG. 3 is an ideal schematic diagram of a differential tapped LC energy storage circuit 302, including a representation of an equivalent inductor 200' of the tapped inductor 200 coupled in parallel to a capacitor C in FIG. 2. Segments V1-V5a, V2-V5a, V3-V5b, V4-V5b, and V5a-V5b in FIG. 2 correspond to inductors L1, L2, L3, L4, and L5 in FIG. 3 respectively.

The differential tapped inductor 200 includes one or more conductive segments (for example, V1-V5a, V4-V5b, and V5a-V5b) constituting a physical loop 201. The term "physical loop" used herein refers to a closed or approximately closed geometric shape that includes at least one noticeable convex part and that has a starting point and an ending point that are co-located or adjacent to each other. The convex part defines internal space of the convex part (for example, a ring-shaped polygon or a ring-shaped polygon segment). Therefore, the physical loop is different from an "electrical loop", and the electrical loop typically represents any shape of closed path through which a current may flow.

The physical loop 201 is symmetrical, and is shown as being generally octagonal when being in the inductor 200. Without departing from the scope of this disclosure, a person skilled in the art should appreciate that the physical loop 201 may include other symmetrical and asymmetric shapes (for example, a rectangle, a square, and a hexagon). The inductor 200 is tapped with the segments V2-V5a and V3-V5b at V5a and V5b by using electrical connection apparatus, forming electrical loops (L2 and L3). The electrical loops are disposed in interior space formed by the physical loop 201 (including L1, L5, and L4).

A capacitor element C of the tapped LC energy storage circuit 302 may be embodied as a PMOS variable capacitance diode, an NMOS variable capacitance diode, a metal-insulator-metal (MIM) device, or any other suitable capacitor element. In a silicon process, two types of variable capacitance diodes may be used, namely, a reverse-biased pn junction diode or a metal-oxide-semiconductor (MOS) capacitor variable capacitance diode. The MOS capacitor variable capacitance diode may include a MOS transistor. A drain, a source, and a main body junction of the MOS transistor are coupled together, and a capacitance is adjusted based on a voltage applied between a main body and a gate junction. Without departing from the scope of this disclosure, a person skilled in the art should appreciate that another alternative element of the capacitor element C of the LC energy storage circuit may be used.

A quality factor (Q) of the tapped LC energy storage circuit 302 depends on the inductor 200 with a low resistance. The resistance of the inductor 200 is minimized by using a thick/wide metallization process such as, but not limited to, aluminum, copper, gold, or another appropriate material to reduce a series resistance. The inductor 200 is formed over a high dielectric substrate material such as silicon, gallium arsenide, or another appropriate material. Surface micro-machining technologies may be used to create an air gap between the inductor and a substrate to further increase a dielectric property.

The tap segments V2-V5a and V3-V5b (L2 and L3) of the inductor are coupled to an output terminal of an amplifier and do not belong to the LC energy storage circuit. In this way, parasitic resistances of the tap segments V2-V5a and V3-V5b are not as critical as parasitic resistances of the inductor segments L1, L4, and L5. Therefore, the segments L2 and L3 may be constructed with a thinner metal material shown in FIG. 2.

A practical problem when using a plurality of inductors (for example, L1 to L5) is a mutual inductance in any connection from the amplifier output to the tap points V5a and V5b. A current of the inductor of the LC energy storage circuit is usually far greater than a current provided by the amplifier based on the circuit factor Q. When the mutual inductance is high, the induced current from the LC energy storage circuit becomes high enough in leads from the amplifier output to the tap point that the input impedance to the tap becomes so high that the amplifier cannot supply any current. To overcome this problem, the tap segments V2-V5a (L2) and V3-V5b (L3) are moved up in the middle of the inductor 200 (as shown in FIG. 2), so that induced currents of two symmetrical halves of the inductor 200 are offset.

Tap positions V5a and V5b may be adjusted on a metal to change power consumption, a VCO output swing, and phase noise performance, which may be used for design of fine-tuning the metal as shown by V5a' and V5b'. To minimize parasitic effects of the substrate, the substrate may be doped with an additive to have a high resistivity, and/or a distance between the metal layer and the substrate may be increased through etching or micro-machining.

Figure 4:
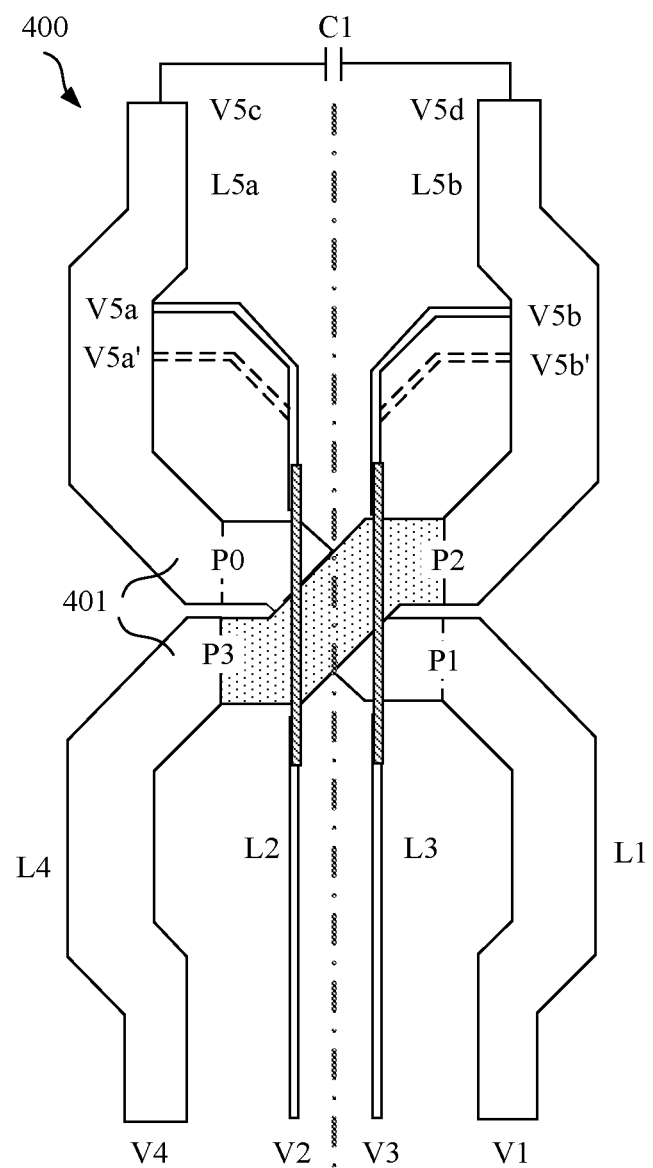
FIG. 4 shows an example layout of a second differential tapped inductor according to an embodiment of this disclosure.

Further, with reference to FIG. 2, as shown in FIG. 4, an embodiment of this disclosure further shows another example layout of a differential tapped inductor 400 integrated into an integrated circuit. In FIG. 4, the tapped inductor 400 is divided into two segments of inductors (namely, a first segment of inductor and a second segment of inductor), and the two segments of inductors are coupled by using a first capacitor C1. Each of the first segment of inductor and the second segment of inductor may be a separate three-end tapped inductor, namely, an inductor with two output terminals and one tap terminal. For example, each segment of inductor may be a winding coil with two output terminals and one tap terminal. In FIG. 4, the first segment of inductor may include V1-V5a, V5a-V5c, and V5a-V2. V1 and V5c may be two output terminals of the first segment of inductor, and V2 may be a tap terminal of the first segment of inductor. The second segment of inductor may include V4-V5b, V5b-V5d, and V5b-V3. V4 and V5d may be two output terminals of the second segment of inductor, and V2 may be a tap terminal of the second segment of inductor.

Figure 5:
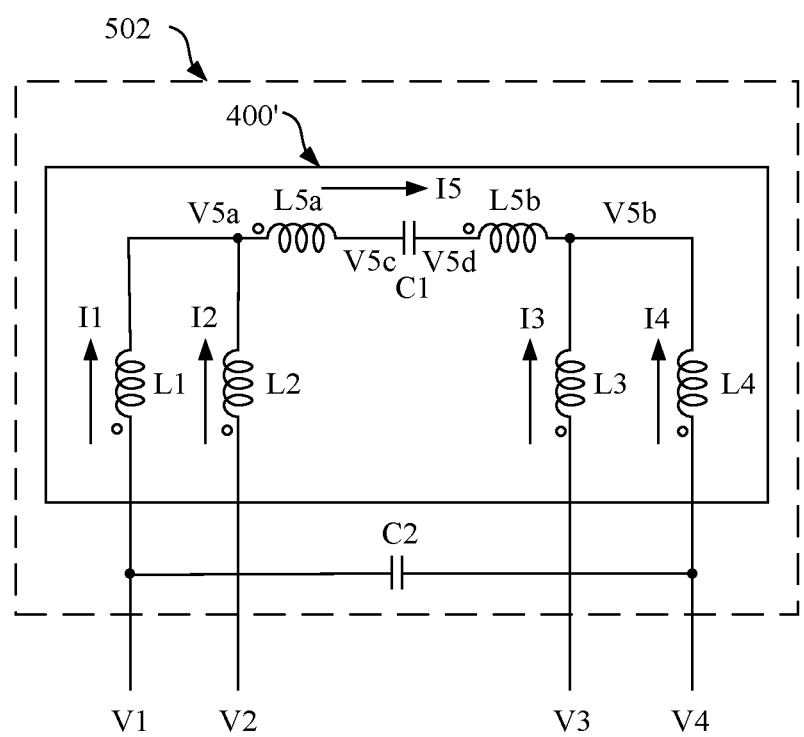
FIG. 5 shows a second differential tapped LC energy storage circuit according to an embodiment of this disclosure.

FIG. 5 is an ideal schematic diagram of a differential tapped LC energy storage circuit 502 corresponding to FIG. 4, including a representation of an equivalent inductor 400' of the tapped inductor 400 coupled in parallel to a second capacitor C2 in FIG. 4. It should be noted that the segment V1-V5a in FIG. 4 corresponds to an inductor L1 in the schematic diagram of FIG. 5, V2-V5a corresponds to an inductor L2 in the schematic diagram of FIG. 5, V3-V5b corresponds to an inductor L3 in the schematic diagram of FIG. 5, V4-V5b corresponds to an inductor L4 in the schematic diagram of FIG. 5, V5a-V5c corresponds to L5a in the schematic diagram of FIGS. 5, and V5b-V5d corresponds to L5b in the schematic diagram of FIG. 5.

The differential tapped inductor 400 includes one or more conductive segments (for example, V1-V5a, V4-V5b, V5a-V5c, and V5b-V5d) constituting an 8-shaped physical loop 401. "8-shaped" herein may be understood as including two ring-shaped or approximately ring-shaped (for example, polygon-shaped) geometric shapes constituting a shape 8, and each of the two geometric shapes is in an axisymmetric structure. The two geometric shapes may be closed shapes, or may be non-closed shapes. Each conductive segment herein may be understood as an inductor with two terminals. For example, each conductive segment may be one coil with two terminals.

In actual application, the plurality of conductive segments constituting the physical loop 401 may be cabled through layer-hopping crossing, and may constitute an 8-shaped physical loop. Optionally, the plurality of conductive segments may be separately cabled at a topmost metal layer and a second topmost metal layer, or may be separately cabled at a topmost metal layer and a redistribution layer (RDL). For example, during cabling, the 8-shaped physical loop 401 may include a non-crossing part and two cross parts, the non-crossing part and one of the two cross parts may be cabled at the topmost metal layer, and the other cross part may be cabled at the second topmost metal layer or the redistribution layer. Taking FIG. 4 as an example, the two cross parts may include P0-P1 and P2-P3, and the non-crossing part includes a part other than P0-P1 and P2-P3 in the physical loop 401. When the physical loop 401 is cabled at the topmost metal layer and the second topmost metal layer, a part in two tap segments that does not overlap the physical loop 401 may be cabled at the topmost metal layer, and a part in the two tap segments that overlaps the physical loop 401 may be cabled at a next metal layer of the second topmost metal layer. When the physical loop 401 is cabled at the topmost metal layer and the redistribution layer, a part in two tap segments that does not overlap the physical loop 401 may be cabled at the topmost metal layer, and a part in the two tap segments that overlaps the physical loop 401 may be cabled at the second topmost metal layer. Certainly, the plurality of conductive segments may be alternatively cabled at another metal layer. This is not limited in this embodiment of this disclosure.

It should be noted that a chip (or a die) of an integrated circuit usually includes a plurality of metal layers. A metal layer close to a substrate of the integrated circuit may be referred to as a low metal layer, and a metal layer away from the substrate may be referred to as a high metal layer. The topmost metal layer may be a metal layer in high metal layers that is farthest from the substrate, and the second topmost metal layer may be a next metal layer of the topmost metal layer. The redistribution layer is located between the chip of the integrated circuit and a package, and the redistribution layer may be an aluminum layer.

In order to improve communication quality, a communication device usually uses an operating mode of multiple input multiple output (MIMO). This also means that a plurality of oscillators need to simultaneously work. However, a chip area of the current communication device is developing toward a smaller size. Therefore, when a plurality of oscillators simultaneously work, if two or more oscillators have a same frequency or a frequency of one oscillator is double that of another oscillator, interference occurs between the oscillators, and consequently, performance of each other is reduced. The tapped inductor 400 shown in FIG. 4 includes two half-8 loops with opposite magnetic field directions. When two magnetic fields with opposite directions are interfered with by each other, generated induced currents are offset, and therefore the tapped inductor 400 has quite good anti-interference performance.

It should be noted that related descriptions corresponding to FIG. 2 and FIG. 3 are also applicable to FIG. 4 and FIG. 5. Details are not described again in this embodiment of this disclosure.

Figure 6:
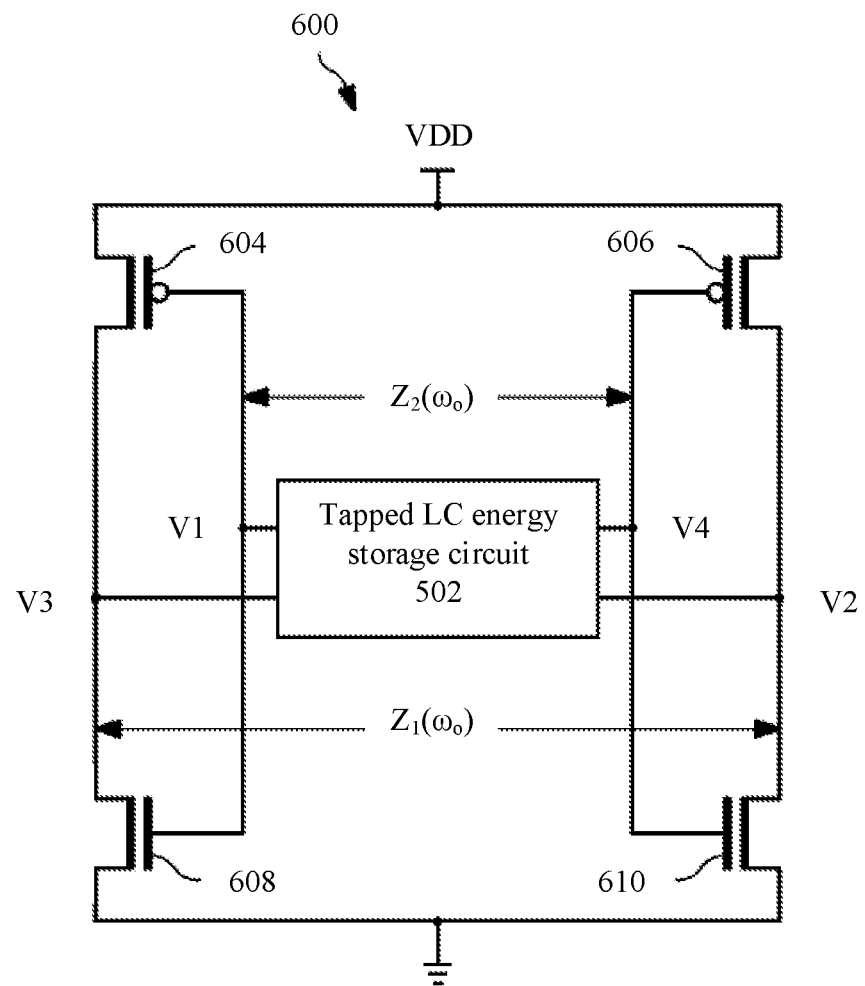
FIG. 6 is a schematic diagram of a first differential VCO according to an embodiment of this disclosure.

FIG. 6 is a schematic diagram of a structure of a differential VCO 600 practiced according to a principle of this disclosure. Refer to FIG. 6. A first transconductance amplifier in an amplifier includes a PMOS transistor 604 and an NMOS transistor 608, and a second transconductance amplifier includes a PMOS transistor 606 and an NMOS transistor 610. Sources of the PMOS transistors 604 and 606 are coupled to a positive supply rail (VDD), and gates of the PMOS transistors 604 and 606 are coupled to gates of the NMOS transistors 608 and 610. Gates of the PMOS transistor 604 and the NMOS transistor 608 are coupled to a tap V1 of a differential tapped LC energy storage circuit 502. Gates of the PMOS transistor 606 and the NMOS transistor 610 are coupled to a tap V4 of the differential tapped LC energy storage circuit 502. Sources of the NMOS transistors 608 and 610 are coupled to a negative supply rail (ground line), and drains of the NMOS transistors 608 and 610 are coupled to drains of the PMOS transistors 604 and 606.

Taps V2 and V3 of the tapped LC energy storage circuit 502 are separately coupled to usually coupled drains of the PMOS transistor 604 and the NMOS transistor 608 and usually coupled drains of the PMOS transistor 606 and the NMOS transistor 610.

Figure 7:
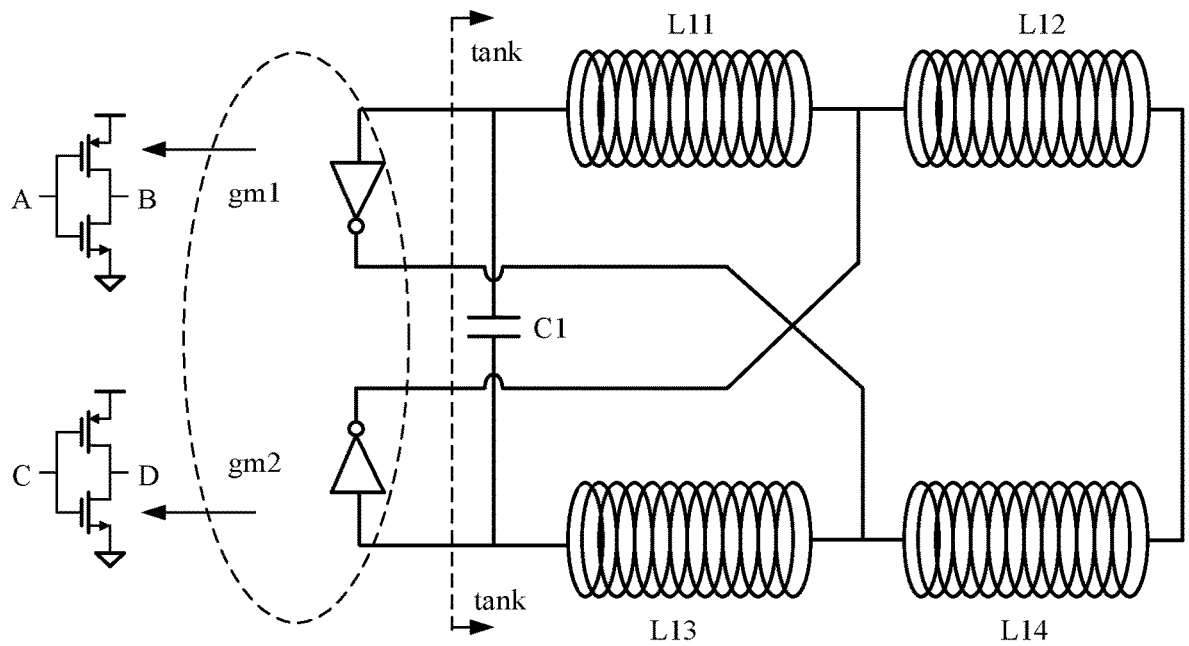
FIG. 7 is a schematic diagram of a second differential VCO according to an embodiment of this disclosure.

For example, FIG. 7 is a schematic diagram of a circuit of an example class AB oscillator using a tapped LC energy storage circuit 302 practiced according to a principle of this disclosure. In FIG. 7, an amplifier includes two amplifier transistors, namely, a first amplifier transistor gm1 (or a first transconductance amplifier) and a second amplifier transistor gm2 (which may also be referred to as a second transconductance amplifier). Each of the two amplifier transistors includes one PMOS transistor and one NMOS transistor. Sources of PMOS transistors in gm1 and gm2 are both coupled to a positive supply rail (VDD), and sources of NMOS transistors in gm1 and gm2 are both coupled to a negative supply rail (ground line). Gates A of the PMOS transistor and the NMOS transistor in gm1 are coupled to a tap V1 of the tapped LC energy storage circuit 302, and drains B of the PMOS transistor and the NMOS transistor in gm1 are coupled to a tap V2 of the differential tapped LC energy storage circuit 302. Gates C of the PMOS transistor and the NMOS transistor in gm2 are coupled to a tap V4 of the differential tapped LC energy storage circuit 302, and drains D of the PMOS transistor and the NMOS transistor in gm2 are coupled to a tap V3 of the differential tapped LC energy storage circuit 302.

It should be noted that, in actual application, equivalent inductors L1 to L5 in the tapped LC energy storage circuit 302 may be designed by using inductors shown by L11 to L14 in FIG. 7. L11 to L14 are merely an example, and do not constitute a limitation on this embodiment of this disclosure.

In FIGS. 7, L11 to L14 and C1 are connected in parallel to form a tank of an oscillator, and the first amplifier transistor gm1 and the second amplifier transistor gm2 form a negative resistance by using cross-coupled positive feedback, to offset loss of the tank, so that a class AB oscillator is formed. For the first amplifier transistor gm1, amplitude of alternating current signals at the gate A and the drain B is different, because L11 and L13 enable impedance at the end B to be less than impedance at the end A. A proportional relationship between the impedance at the end B and the impedance at the end A is approximately (L14+L11+L12)/(L11+L12+L13+L14) based on a small-signal linear analysis. Therefore, magnitude of the impedance at the drain B of the first amplifier transistor gm1 can be increased by selecting a different proportional relationship between L13 and L14, so that the first amplifier transistor gm1 can work in a linear region of a class AB mode. Compared with a conventional CMOS oscillator, the class AB oscillator obtained through inductive feedback in FIG. 7 has a gate with larger oscillation amplitude, to reduce drain non-linearity, and therefore phase noise is lower.

Figure 8:
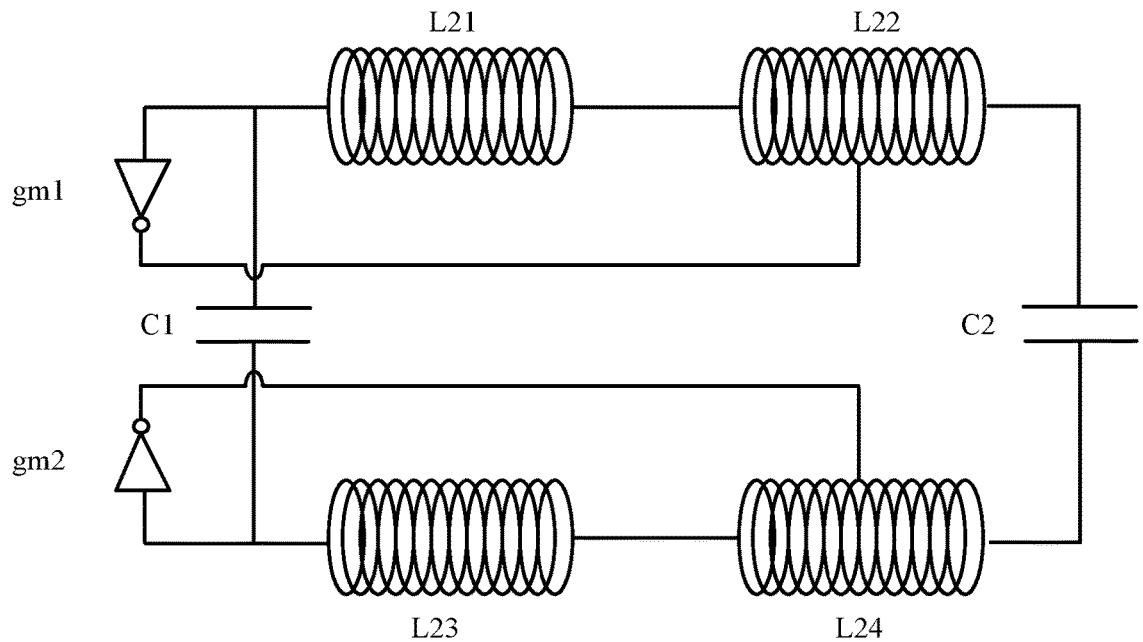
FIG. 8 is a schematic diagram of a third differential VCO according to an embodiment of this disclosure.

For example, FIG. 8 is a schematic diagram of a circuit of an example class AB oscillator using a tapped LC energy storage circuit 502 practiced according to a principle of this disclosure. In FIG. 8, an amplifier includes two amplifier transistors, namely, a first amplifier transistor gm1 and a second amplifier transistor gm2. The first amplifier transistor gm1 and the second amplifier transistor gm2 herein are consistent with gm1 and gm2 in FIG. 7. For detailed descriptions, refer to related descriptions in FIG. 7. Details are not described again in this embodiment of this disclosure.

In actual application, equivalent inductors L1 to L5b in the differential tapped LC energy storage circuit 502 may be designed by using inductors shown by L21 to L24 in FIG. 8. L21 to L24 are merely an example, and do not constitute a limitation on this embodiment of this disclosure. In addition, the class AB oscillator that is obtained through inductive feedback and that is shown in FIG. 8 is consistent with the class AB oscillator shown in FIG. 7, and also has low phase noise. For detailed principle descriptions, refer to related descriptions in FIG. 7.

In addition, to reduce phase noise of the oscillator, two oscillators may be coupled together by using a transformer or a capacitor. In the power coupling method, a signal-to-noise ratio of output of the VCO is reduced by half, so that the noise is reduced by 3 decibel (dB). In FIG. 8, an intermediate tap of the inductor L22 is coupled to an output stage of the first amplifier transistor gm1, so that gm1, L21, and L22 constitute one single-end three-point oscillation VCO circuit. Similarly, an intermediate tap of the inductor L24 is coupled to an output stage of the second amplifier transistor gm2, so that gm2, L23, and L24 constitute another symmetrical single-end three-point oscillation VCO circuit. The two VCOs are coupled together by using a first capacitor C1 and a second capacitor C2, so that equivalent inductance is doubled and an equivalent capacitance is reduced by half. In this way, signal energy is doubled, so that the phase noise is reduced by 3 dB.

Figure 9:
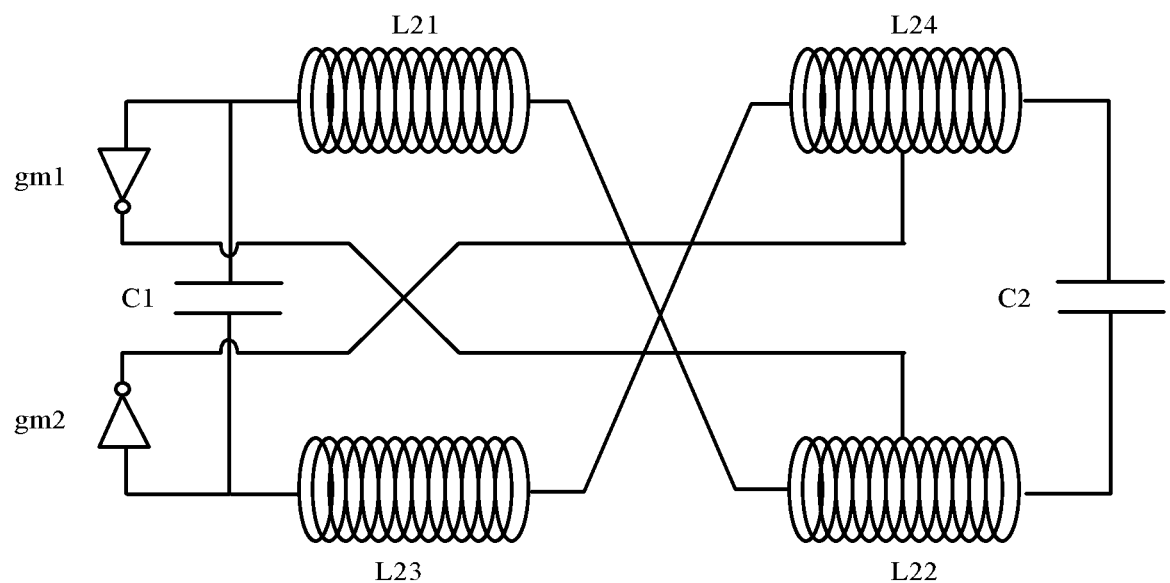
FIG. 9 is a schematic diagram of a fourth differential VCO according to an embodiment of this disclosure.

Because an 8-shaped inductor has an anti-interference characteristic, L21 to L24 in FIG. 8 are disposed as an 8-shaped physical loop, so that L21 to L24 can form two magnetic fields with opposite directions, to implement anti-interference. For example, as shown in FIG. 9, when the inductor is designed in a shape 8, positions of L22 and L24 in FIG. 8 may be transposed, and then L21 and L23 are disposed as one half of the shape 8, and L22 and L24 are disposed as the other half of the shape 8, to obtain an 8-shaped physical loop.

Modern integrated circuit designing and manufacturing are commonly automated with electronic design automation (EDA) tools. Example tools may be found from companies such as, but not limited to, Synopsys, Cadence, and Mentor Graphics. Details of these EDA tools are not required in this disclosure.

Figure 10:
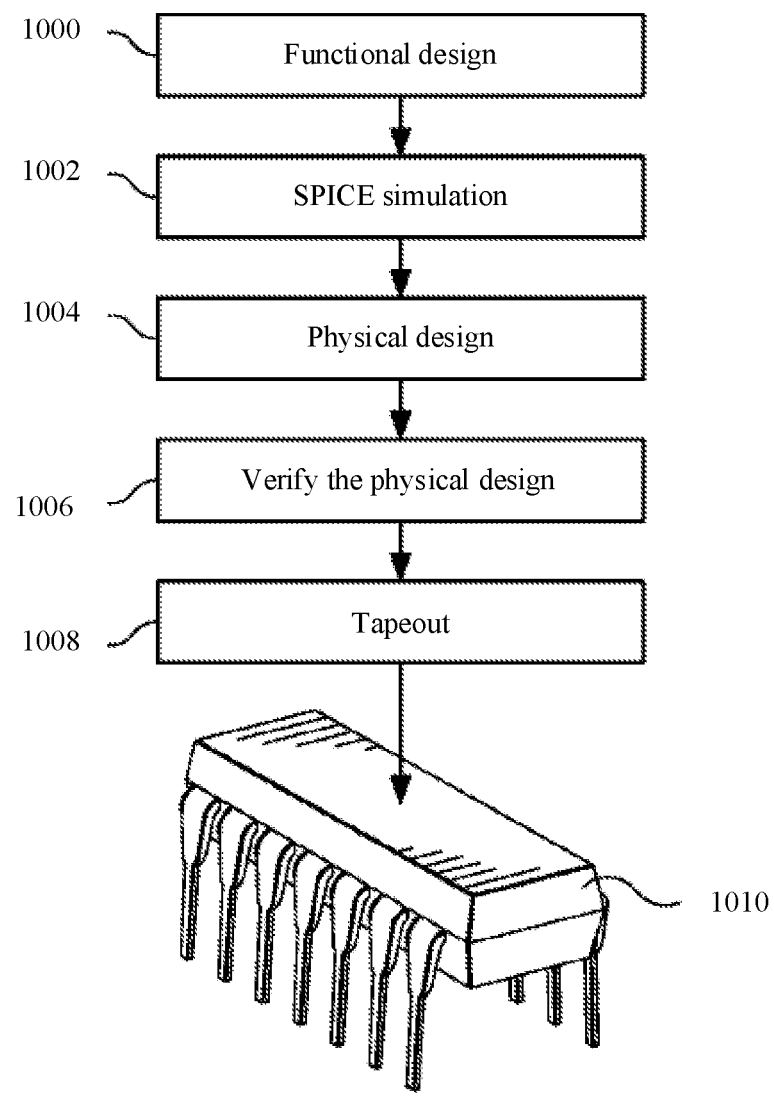
FIG. 10 is a flowchart of design of an ASIC according to an embodiment of this disclosure.

FIG. 10 shows a simplified general ASIC design procedure for producing an ASIC in embodiments of this disclosure using an EDA tool. In step 1000, functional design of an ASIC that may include a VCO is created. The VCO has a tapped inductor practiced according to a principle of this disclosure.

Actually, for ASIC digital, the functional design is typically manifested by writing register transfer level (RTL) code in a hardware descriptive language (HDL) such as, but not limited to, VHDL or Verilog. A functional verification (behavioral simulation) is then performed on the HDL data structures to ensure that the RTL design is in accordance with the logic specifications. Alternatively, a schematic diagram of a digital logic may be captured by using a schematic diagram capture program.

For a part of the ASIC actually simulated (such as the VCO having a tapped inductor in this disclosure), a simulation functional design is typically manifested by capturing a schematic diagram by using the schematic diagram capture program. Then output of the schematic diagram capture program is converted (combined) into a gate/transistor-level netlist data structure.

In step 1002, the data structure is simulated by using a simulation program with integrated circuit emphasis (simulation program with integrated circuit emphasis, SPICE). In step 1004, the data structure obtained in step 1002 is instantiated by using a geometric representation of the data structure, and a physical layout of the ASIC is performed.

The first step in the physical layout is usually "layout planning". In this step, a total region on a chip of the integrated circuit is allocated, and an input/output (I/O) pin is defined. Hard cores (for example, arrays, simulation blocks, and inductors) are disposed in gross regions based on design constraints (for example, trace lengths and timing). Clock wiring (commonly referred to as a clock tree) is disposed, and a connection between a gate and a simulation block is routed. When all elements are disposed, a global and detailed wiring runs to connect all the elements together. Postwiring optimization is performed to improve performance (timing closure), noise (signal integrity), and yield. The layout is modified when possible, and maintains compliance with design rules set by a selected internal or external semiconductor manufacturing foundry, to improve production efficiency. Such modifications may include adding extra vias or dummy metal/diffusion/poly layers.

In step 1006, verification is performed on the physical design. Design rule checking (DRC) is performed to determine whether the physical layout of the ASIC satisfies a series of recommended parameters, namely, the design rules of the foundry. The design rules are the series of parameters provided by the foundry for a specific semiconductor manufacturing process. The design rules specify some geometric and connectivity constraints to ensure sufficient margins to account for variability in semiconductor manufacturing processes. This ensures that the ASICs work normally. A layout versus schematic (LVS) check is performed to verify that the physical layout corresponds to an original schematic or circuit diagram of the design. A complete simulation is then performed to ensure a layout phase is properly done.

After verification is performed on the layout in step 1006, mask generation design data usually presented in a form of a Graphic Database System Information Interchange (GDSII) data structure is referred to as "tapeout" used to produce a photomask in step 1008. The GDSII data structure is transferred through a communication medium (for example, a memory or a network) from a circuit designer to either a photomask supplier/maker or directly to the semiconductor foundry.

In step 1010, a photomask is created, and the photomask is used to produce an ASIC according to a principle of this disclosure.

Some techniques described herein may be implemented by software stored on one or more computer-readable storage media and executed on a computer. The selected techniques could be executed on a single computer or a computer networked with another computer or computers. For clarity, only those aspects of the tools or computer germane to the disclosed techniques are described. Product details well known in the art may be omitted.

Figure 11:
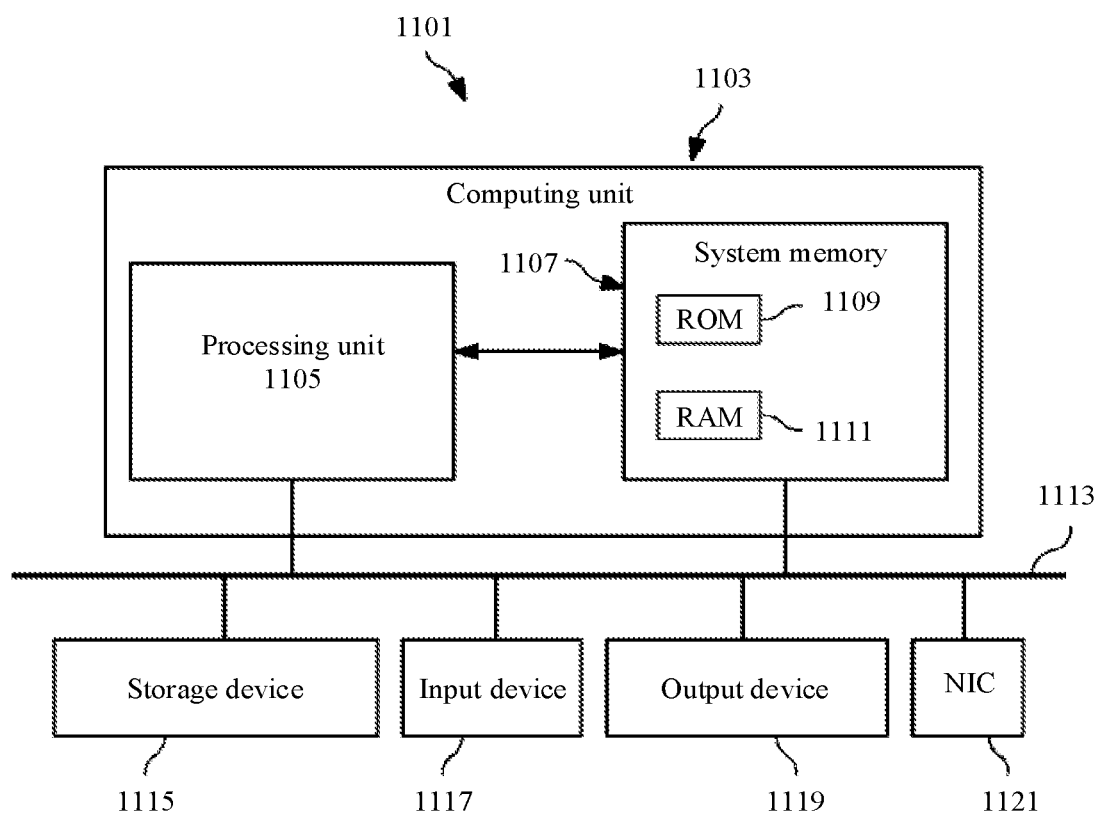
FIG. 11 shows an illustrative example of a computing device according to an embodiment of this disclosure.

FIG. 11 shows an illustrative example of a computing device 1101 for practicing the design produce of FIG. 10. As shown in FIG. 11, the computing device 1101 includes a computing unit 1103 having a processing unit 1105 and a system memory 1107. The processing unit 1105 may be any type of programmable electronic device for executing software instructions, but is conventionally a microprocessor. The system memory 1107 may include a read-only memory (ROM) 1109 and a random-access memory (RAM) 1111. A person of ordinary skill in the art should understand that both the ROM 1109 and the RAM 1111 can store the software instructions executed by the processing unit 1105.

The processing unit 1105 and the system memory 1107 are directly or indirectly connected to one or more peripheral devices by using a bus 1113 or an alternative communication structure. For example, the processing unit 1105 or the system memory 1107 may be directly or indirectly connected to one or more additional storage devices 1115. The storage device 1115 may include a "hard" disk drive, a solid-state disk drive, an optical disk drive, a removable disk drive, and the like. The processing unit 1105 and the system memory 1107 may be further directly or indirectly connected to one or more input devices 1117 and one or more output devices 1119. The input devices 1117 may include, for example, a keyboard, a pointing device (such as a mouse, touchpad, stylus, trackball, or joystick), a scanner, a camera, and a microphone. The output devices 1119 may include, for example, a display device, a printer, and a speaker. For various examples of the computing device 1101, computing units 1103 may be disposed inside one or more of the peripheral devices 1115 to 1119. Alternately, one or more of the peripheral devices 1115 to 1119 may be disposed outside the housing for the computing unit 1103 and connected to the bus 1113 through, for example, a Universal Serial Bus (USB) connection or a digital visual interface (DVI) connection.

In some implementations, the computing unit 1103 may be directly or indirectly connected to one or more network interface cards (NICs) 1121, for communicating with other devices making up a network. The network interface card 1121 translates data and control signals from the computing unit 1103 into network messages according to one or more communication protocols, such as the Transmission Control Protocol (TCP) and the Internet Protocol (IP). In addition, the network interface card 1121 may use any suitable connection agent (or combination of agents) for connecting to a network, including a wireless transceiver, a modem, an Ethernet connection, or the like.

It should be understood that the computing device 1101 is illustrated only as an example, and not intended to be limiting. Embodiments of this disclosure may be implemented by using one or more computing devices. The one or more computing devices include components of the computing device 1101 shown in FIG. 11 or an alternative combination of the components (including components that are not shown in FIG. 11). For example, embodiments of this disclosure may be implemented by using a multi-processor computer, a plurality of single and/or multi-processor computers disposed in a network, or a combination of both.

In an embodiment, in an oscillator circuit with a resonance apparatus and an amplification apparatus, the amplification apparatus includes a first transconductance amplifier and a second transconductance amplifier. The resonance apparatus includes a capacitor element and an inductor element. The capacitor element includes a first capacitor and a second capacitor, the inductor element includes a tapped inductor, the tapped inductor includes a first segment of inductor and a second segment of inductor, and the first segment of inductor and the second segment of inductor are coupled by using the first capacitor. The first segment of inductor includes a first terminal and a second terminal. The second segment of inductor includes a third terminal and a fourth terminal. The first terminal and the second terminal are respectively coupled to an input terminal and an output terminal of the first transconductance amplifier. The third terminal and the fourth terminal are respectively coupled to an input terminal and an output terminal of the second transconductance amplifier. The first terminal and the fourth terminal are coupled by using the second capacitor. In an embodiment, the tapped inductor includes a plurality of conductive segments, and the plurality of conductive segments constitute an 8-shaped physical loop through layer-hopping crossing.

In another embodiment, a computer apparatus includes a storage apparatus that is configured to store computer instructions having a photomask data, and is configured to produce an oscillator including a resonance apparatus and an amplification apparatus. The amplification apparatus includes a first transconductance amplifier and a second transconductance amplifier. The resonance apparatus includes a capacitor element and an inductor element. The capacitor element includes a first capacitor and a second capacitor, the inductor element includes a tapped inductor, the tapped inductor includes a first segment of inductor and a second segment of inductor, and the first segment of inductor and the second segment of inductor are coupled by using the first capacitor. The first segment of inductor includes a first terminal and a second terminal. The second segment of inductor includes a third terminal and a fourth terminal. The first terminal and the second terminal are respectively coupled to an input terminal and an output terminal of the first transconductance amplifier. The third terminal and the fourth terminal are respectively coupled to an input terminal and an output terminal of the second transconductance amplifier. The first terminal and the fourth terminal are coupled by using the second capacitor.

In still another embodiment, a floorplanning apparatus includes logic for defining or assigning gross regions on the integrated circuit and for defining input/output (I/O) pins. The floorplanning apparatus includes a hard core (for example, an array, simulation block, and an inductor) placing apparatus for disposing in the gross regions based on the design constraints (for example, the trace lengths and timing). A clock wiring placing apparatus (commonly referred to as a clock tree) is configured for placing the clock tree and for routing connections between a gate and a simulation block. A global and detailed routing apparatus is configured to design connections to connect all the elements together.

A physical design verification apparatus including a design rule checking apparatus is configured to verify the physical design of the circuit (for example, an ASIC) satisfies one or more design rules. The design rules specify some geometric and connectivity constraints to ensure sufficient margins to account for variability in semiconductor manufacturing processes. This ensures that the ASICs work normally. A layout versus schematic (LVS) apparatus is configured to verify that the physical layout corresponds to the original schematic or circuit diagram of the design. A simulation apparatus is configured to perform a complete simulation to ensure the layout phase is properly done.

A tapeout apparatus is configured to generate mask generation design data typically in the form of the GDSII data structure for manufacturing photomasks. The GDSII data structure is transferred through the communication medium (for example, the memory or the network) from the circuit designer to either the photomask supplier/maker or directly to the semiconductor foundry. A photomask creation apparatus creates a photomask used to produce an ASIC according to a principle of this disclosure. In other characteristics, it should be understood that the apparatus is configured to generate the resonance apparatus and the amplification apparatus described and required herein.

Some techniques described herein may be implemented by software stored on one or more computer-readable storage media and executed on a computer. The selected techniques could be executed on a single computer or a computer networked with another computer or computers. For clarity, only those aspects of the tools or computer germane to the disclosed techniques are described. Product details well known in the art may be omitted.

Although features and elements are described above in particular combinations, each feature or element may be used alone without the other features and elements or in various combinations with or without other features and elements. Examples of computer-readable storage media include a ROM, a RAM, a register, a cache memory, a semiconductor memory device, a magnetic medium such as an internal hard disk and a removable disk, a magneto-optical medium, an optical medium such as a compact disc (CD) ROM (CD-ROM) disk, and a DIGITAL VERSATILE DISC (DVD).

This disclosure describes some embodiments and generally associated methods. However, variation or replacement of these embodiments and methods may be apparent to a person skilled in the art. In particular, it should be noted that although this disclosure has been described in a context of a CMOS amplifier, a person skilled in the art should appreciate application of PMOS and NMOS amplifiers, a bipolar amplifier, and another suitable topology without departing from the scope of this disclosure. This disclosure is applicable to almost all communication systems. For example, this disclosure may be used in a cellular transceiver, two-way radio communication, a WI-FI application, a satellite receiver, and any application that uses a VCO.

It should be noted that, embodiments of this disclosure and the accompanying drawings are merely examples. Each MOS transistor in any embodiment or accompanying drawing may be a single MOS transistor that satisfies a required start-up gain or a required on-current, or may be a MOS transistor combination that is formed by connecting a plurality of MOS transistors in parallel and that satisfies the required start-up gain or the required on-current. In other words, a sum of start-up gains corresponding to all of the plurality of MOS transistors is greater than or equal to the required start-up gain. Each capacitor in embodiments of this disclosure may be one capacitor that satisfies a required capacitance, or may be a capacitor combination that is formed by connecting a plurality of capacitors in parallel or in series and that satisfies the required capacitance. In other words, a corresponding capacitance obtained after the plurality of capacitors are connected in parallel or in series is equal to the required capacitance. Each inductor in embodiments of this disclosure may be one inductor that satisfies a required inductance, or may be an inductor combination that is formed by connecting a plurality of inductors in parallel or in series and that satisfies the required inductance. Each resistor in embodiments of this disclosure may be one resistor that satisfies a required resistance, or may be a resistor combination that is formed by connecting a plurality of resistors in parallel or in series and that satisfies the required resistance. In other words, a corresponding resistance obtained after the plurality of resistors are connected in parallel or in series is equal to the required resistance.

Finally, it should be noted that the foregoing descriptions are merely specific implementations of this disclosure, but are not intended to limit the protection scope of this disclosure. Any variation or replacement within the technical scope disclosed in this disclosure shall fall within the protection scope of this disclosure. Therefore, the protection scope of this disclosure shall be subject to the protection scope of the claims.

What is claimed is:

1. An oscillator circuit, comprising:
    an amplifier comprising:
        a first transconductance amplifier comprising:
            a first input terminal; and
            a first output terminal; and
        a second transconductance amplifier comprising:
            a second input terminal; and
            a second output terminal; and
    a resonator comprising:
        a capacitor element comprising:
            a first capacitor; and
            a second capacitor; and
        an inductor element comprising a tapped inductor that comprises:
            a first segment of inductor comprising:
                a first terminal coupled to the first input terminal;
                a second terminal coupled to the first output terminal; and
                a fifth terminal;
            a second segment of inductor and comprising:
                a third terminal coupled to the second input terminal;
                a fourth terminal coupled to the second output terminal and further coupled to the first terminal using the second capacitor and
                a sixth terminal,
                wherein the first terminal and the fourth terminal are output terminals of the tapped inductor,
                wherein the second terminal and the third terminal are tap terminals of the tapped inductor, and
                wherein the fifth terminal and the sixth terminal are coupled using the first capacitor.

2. The oscillator circuit of claim 1, wherein the tapped inductor further comprises a plurality of conductive segments that constitute an 8-shaped physical loop through layer-hopping crossing.

3. The oscillator circuit of claim 2, wherein the conductive segments are configured to be separately cabled at a topmost metal layer of a chip and a second topmost metal layer of the chip.

4. The oscillator circuit of claim 3, wherein the conductive segments comprise a non-crossing part and two cross parts, wherein the non-crossing part and a first of the two cross parts are configured to be cabled at the topmost metal layer, and wherein a second of the two cross parts is configured to be cabled at the second topmost metal layer.

5. The oscillator circuit of claim 1, wherein two tap segments corresponding to the second terminal and the third terminal are cabled in a middle of the tapped inductor.

6. The oscillator circuit of claim 1, wherein an input voltage of the amplifier is configured to exceed a supply voltage of the amplifier.

7. The oscillator circuit of claim 1, wherein each of the first transconductance amplifier and the second transconductance amplifier comprises an N-type metal-oxide-semiconductor (NMOS) transistor and a P-type metal-oxide-semiconductor (PMOS) transistor, wherein a source of the PMOS transistor is configured to couple to a positive supply rail, wherein gates of the NMOS transistor and the PMOS transistor are coupled as a third input terminal, wherein drains of the NMOS transistor and the PMOS transistor are coupled as a third output terminal, and wherein a source of the NMOS transistor is configured to couple to a ground terminal.

8. The oscillator circuit of claim 1, wherein the second segment of inductor is coupled to the first segment of inductor using the first capacitor.

9. The oscillator circuit of claim 2, wherein the conductive segments are configured to be separately cabled at a topmost metal layer of a chip and a redistribution layer located between the chip and a package.

10. The oscillator circuit of claim 9, wherein the conductive segments comprise a non-crossing part and two cross parts, wherein the non-crossing part and a first of the two cross parts are configured to be cabled at the topmost metal layer, and wherein a second of the two cross parts is configured to be cabled at the redistribution layer.

11. A computer program product comprising computer-executable instructions that are stored on a non-transitory computer-readable medium and that, when executed by a processor, cause an apparatus to produce an oscillator circuit comprising:
an amplifier comprising:
a first transconductance amplifier comprising:
a first input terminal; and
a first output terminal; and
a second transconductance amplifier comprising:
a second input terminal; and
a second output terminal; and
a resonator comprising:
a capacitor element comprising:
a first capacitor; and
a second capacitor; and
an inductor element comprising a tapped inductor that comprises:
a first segment of inductor comprising:
a first terminal coupled to the first input terminal;
a second terminal coupled to the first output terminal; and
a fifth terminal;
a second segment of inductor comprising:
a third terminal coupled to the second input terminal;
a fourth terminal coupled to the second output terminal and further coupled to the first terminal using the second capacitor; and
a sixth terminal,
wherein the first terminal and the fourth terminal are output terminals of the tapped inductor,
wherein the second terminal and the third terminal are tap terminals of the tapped inductor, and
wherein the fifth terminal and the sixth terminal are coupled using the first capacitor.

12. The computer program product of claim 11, wherein the tapped inductor further comprises a plurality of conductive segments that constitute an 8-shaped physical loop through layer-hopping crossing.

13. The computer program product of claim 12, wherein the conductive segments are configured to be separately cabled at a topmost metal layer of a chip and a second topmost metal layer of the chip.

14. The computer program product of claim 13, wherein the conductive segments comprise a non-crossing part and two cross parts, wherein the non-crossing part and a first of the two cross parts are configured to be cabled at the topmost metal layer, and wherein a second of the two cross parts is configured to be cabled at the second topmost metal layer.

15. The computer program product of claim 12, wherein the conductive segments are configured to be separately cabled at a topmost metal layer of a chip and a redistribution layer located between the chip and a package.

16. The computer program product of claim 15, wherein the conductive segments comprise a non-crossing part and two cross parts, wherein the non-crossing part and a first of the two cross parts are configured to be cabled at the topmost metal layer, and wherein a second of the two cross parts is configured to be cabled at the redistribution layer.

17. The computer program product of claim 11, wherein two tap segments corresponding to the second terminal and the third terminal are cabled in a middle of the tapped inductor.

18. The computer program product of claim 11, wherein an input voltage of the amplifier is configured to exceed a supply voltage of the amplifier.

19. The computer program product of claim 11, wherein each of the first transconductance amplifier and the second transconductance amplifier comprises an N-type metal-oxide-semiconductor (NMOS) transistor and a P-type metal-oxide-semiconductor (PMOS) transistor, wherein a source of the PMOS transistor is configured to couple to a positive supply rail, wherein gates of the NMOS transistor and the PMOS transistor are coupled as a third input terminal, wherein drains of the NMOS transistor and the PMOS transistor are coupled as a third output terminal, and wherein a source of the NMOS transistor is configured to couple to a ground terminal.

20. The computer program product of claim 11, wherein the second segment of inductor is coupled to the first segment of inductor using the first capacitor.

* * * * *